(12) United States Patent
Yin et al.

(10) Patent No.: US 9,337,406 B2
(45) Date of Patent: May 10, 2016

(54) GAN-BASED LIGHT EMITTING DIODE WITH CURRENT SPREADING STRUCTURE

(71) Applicant: XIAMEN SANAN OPTOELECTRONICS TECHNOLOGY CO., LTD., Xiamen (CN)

(72) Inventors: Lingfeng Yin, Xiamen (CN); Suhui Lin, Xiamen (CN); Jiansen Zheng, Xiamen (CN); Chuangui Liu, Xiamen (CN); Yide Ou, Xiamen (CN); Gong Chen, Xiamen (CN)

(73) Assignee: XIAMEN SANAN OPTOELECTRONICS TECHNOLOGY CO., LTD., Xiamen (CN)

( * ) Notice: Subject to any disclaimer, the term of this patent is extended or adjusted under 35 U.S.C. 154(b) by 0 days.

(21) Appl. No.: 14/641,383

(22) Filed: Mar. 7, 2015

(65) Prior Publication Data

US 2015/0188015 A1    Jul. 2, 2015

Related U.S. Application Data

(63) Continuation of application No. PCT/CN2013/084259, filed on Sep. 26, 2013.

(30) Foreign Application Priority Data

Oct. 18, 2012   (CN) .......................... 2012 1 0395722

(51) Int. Cl.
*H01L 29/15*     (2006.01)
*H01L 33/62*     (2010.01)
(Continued)

(52) U.S. Cl.
CPC .............. *H01L 33/62* (2013.01); *H01L 33/007* (2013.01); *H01L 33/0075* (2013.01); *H01L 33/08* (2013.01); *H01L 33/32* (2013.01); *H01L 33/38* (2013.01); *H01L 33/387* (2013.01);
(Continued)

(58) Field of Classification Search
CPC ... H01L 33/007; H01L 33/0075; H01L 33/08; H01L 33/32; H01L 33/387; H01L 33/42; H01L 33/62
USPC .......................................... 257/76; 438/47, 98
See application file for complete search history.

(56) References Cited

U.S. PATENT DOCUMENTS

2010/0123166 A1* 5/2010 Bae .................... H01L 33/14
                                                                257/103
2010/0141175 A1* 6/2010 Hasnain ............. H01L 27/153
                                                                315/294

(Continued)

FOREIGN PATENT DOCUMENTS

WO      2012/067311 A1     5/2012

*Primary Examiner* — Jae Lee
*Assistant Examiner* — Colleen E Snow
(74) *Attorney, Agent, or Firm* — Syncoda LLC; Feng Ma; Junjie Feng

(57) ABSTRACT

A GaN-based LED with a current spreading structure, the LED including a substrate, a light-emitting epitaxial layer over the substrate, and a current spreading structure over the light-emitting epitaxial layer. The current spreading structure includes a transparent electrode spreading bar, and a metal electrode spreading bar attached to the side wall of the transparent electrode spreading bar. The current spreading structure can improve the current spreading effect, reducing or eliminating of electrode shading, improving luminous efficiency of the LED, and avoid or reduce high voltage (Vf).

20 Claims, 2 Drawing Sheets

(51) Int. Cl.
*H01L 33/38* (2010.01)
*H01L 33/42* (2010.01)
*H01L 33/00* (2010.01)
*H01L 33/08* (2010.01)
*H01L 33/32* (2010.01)

(52) U.S. Cl.
CPC ........ *H01L 33/42* (2013.01); *H01L 2933/0016* (2013.01); *H01L 2933/0066* (2013.01)

(56) References Cited

U.S. PATENT DOCUMENTS

2011/0309378 A1* 12/2011 Lau .................. H01L 33/08
257/88
2012/0175662 A1 7/2012 Min et al.

* cited by examiner

GAN-BASED LIGHT EMITTING DIODE WITH CURRENT SPREADING STRUCTURE

CROSS-REFERENCE TO RELATED APPLICATIONS

The present application is a continuation of, and claims priority to, PCT/CN2013/084259 filed on Sep. 26, 2013, which claims priority to Chinese Patent Application No. 201210395722.2 filed on Oct. 18, 2012. The disclosures of these applications are hereby incorporated by reference in their entirety.

BACKGROUND

As a promising lighting source for the future, the light emitting diode (LED) is a solid-state semiconductor device, which directly transfers electricity into light with such advantages as free pollution, high luminance, low power consumption, long service life and low working voltage. The GaN-based LED uses ITO as the P-type electrode chip in replacement of Ni/Au, which improves the luminance by 20%-30% compared with conventional electrode chip. Among many transparent electrodes (TCL), the ITO, CTO, InO and ZnO can improve the current spreading effects.

Patent Application No. CN200710091743.4 discloses a semiconductor light-emitting device with laminated transparent electrode, the disclosure of which is hereby incorporated by reference in its entirety. A transparent electrode is used as the current spreading bar to increase current spreading effect, eliminate electrode shading and increase light-emitting luminance. However, it can easily cause a high LED chip voltage (Vf). Therefore, Au metal or Au alloy is commonly used as the current spreading material in industry.

SUMMARY

To solve the above problems, various embodiments described below provide a GaN-based LED with a current spreading structure.

Some embodiments include: a GaN-based LED with current spreading structure, wherein, the LED structure comprises a substrate, a light-emitting epitaxial layer over the substrate and a current spreading structure over the light-emitting epitaxial layer, which comprises a transparent electrode spreading bar and a metal electrode spreading bar, wherein, the side wall of the metal electrode spreading bar is attached to the side wall of the transparent electrode spreading bar. The current spreading structure in this present disclosure not only improves the current spreading effect but also has such advantages as elimination of electrode shading, improvement of luminous efficiency and avoidance of high voltage (Vf).

Preferably, a transparent conducting layer can be formed over the light-emitting epitaxial layer before formation of a current spreading structure.

Preferably, the metal electrode spreading bar is at the single-side wall or dual-side wall of the transparent electrode spreading bar.

Preferably, the substrate is made of one or any combination of sapphire ($Al_2O_3$), SiC, Si or GaN.

Preferably, the light-emitting epitaxial layer comprises an N—GaN layer, a light-emitting layer and a P—GaN layer.

Preferably, the transparent conducting layer is made of one or any combination of ITO, ZnO, CTO, InO, In-doped ZnO, Al-doped ZnO or Ga-doped ZnO.

Preferably, the transparent electrode spreading bar is made of one or any combination of ITO, ZnO, CTO, InO, In-doped ZnO, Al-doped ZnO or Ga-doped ZnO.

Preferably, the metal spreading bar is made of Au, Ni/Au, Cr/Au alloy or Cr/Pt/Au alloy.

Preferably, the transparent electrode spreading bar is about 0.001-2 μm thick.

Preferably, the metal electrode spreading bar is about 0.001-2 μm thick.

Preferably, the metal electrode spreading bar is about 0.001-0.5 μm wide.

In another aspect, a lighting system is provided including a plurality of the LEDs disclosed herein. In another aspect, a method of fabricating the LEDs and the lighting system is provided. Compared with the other technologies, various embodiments disclosed herein may have one of more of the following advantages: (1) a metal electrode spreading bar is formed at the side wall of the transparent electrode spreading bar for current spreading and avoiding high chip voltage due to single use of the transparent electrode spreading bar; (2) the luminous efficiency is greatly improved as the upper surface of the transparent electrode spreading bar has no metal electrode spreading bar which may cause shading; (3) the metal electrode spreading bar attached to the side wall of the transparent electrode spreading bar is extremely narrow, which is not vulnerable to tilting or wrapping while current spreading function is reserved and the electrode shading is eliminated. The conventional metal electrode spreading bar is more than 5 μm wide in general.

100: substrate; 101: light-emitting epitaxial layer; 102: transparent conducting layer; 103: transparent electrode spreading bar; 104: metal electrode spreading bar; 105: P electrode; 106: N electrode; 107: n-type confinement layer; 108: light-emitting layer; 109: p-type confinement layer.

DETAILED DESCRIPTION

The following embodiments provide a GaN-based LED with current spreading structure, comprising a substrate, a light-emitting epitaxial layer and a current spreading structure. The current spreading structure comprises a transparent electrode spreading bar and a metal electrode spreading bar attached to the side wall of the transparent electrode spreading bar.

The substrate can be used for growing the light-emitting epitaxial layer. For example, any one or combination of sapphire ($Al_2O_3$), SiC, Si or GaN can be used for epitaxial growth; or can be used as a supporting substrate, which is generally heat-dissipation material like ceramic substrate.

In some embodiments, a transparent conducting layer, made of one or any combination of ITO, ZnO, CTO, InO, In-doped ZnO, Al-doped ZnO or Ga-doped ZnO, can be formed over the surface of the light-emitting epitaxial layer before fabrication of the current spreading structure over the transparent conducting layer.

In the current spreading structure, the metal electrode spreading bar is at the single-side wall or dual-side wall of the transparent electrode spreading bar. The transparent electrode spreading bar is about 0.001-2 μm thick, with material same as the transparent conducting layer; the metal spreading bar is made of Au, Ni/Au alloy, Cr/Au alloy or Cr/Pt/Au alloy with thickness equaling to or less than the transparent electrode spreading bar, e.g., 0.001-2 µm; and the width can be 0.001-0.5 µm.

The embodiments of the present disclosure will be described in detail with reference to the accompanying drawings and examples, to help understand and practice the disclosed embodiments, regarding how to solve technical problems using technical approaches for achieving the technical effects.

Embodiments

Figure 1:
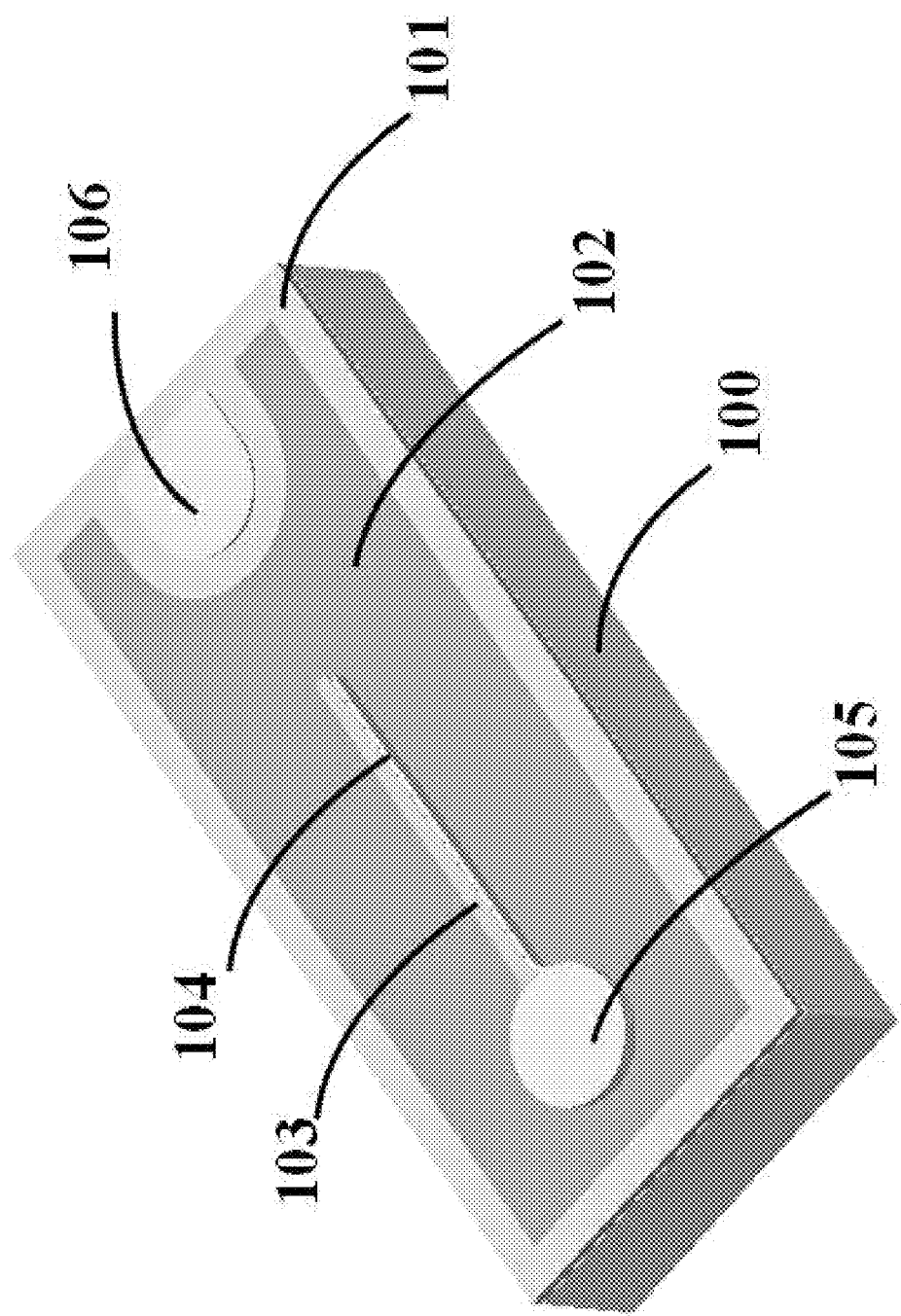
FIG. 1 is a three-dimensional schematic diagram of a GaN-based LED with a current spreading structure according to some embodiments.
Figure 2:
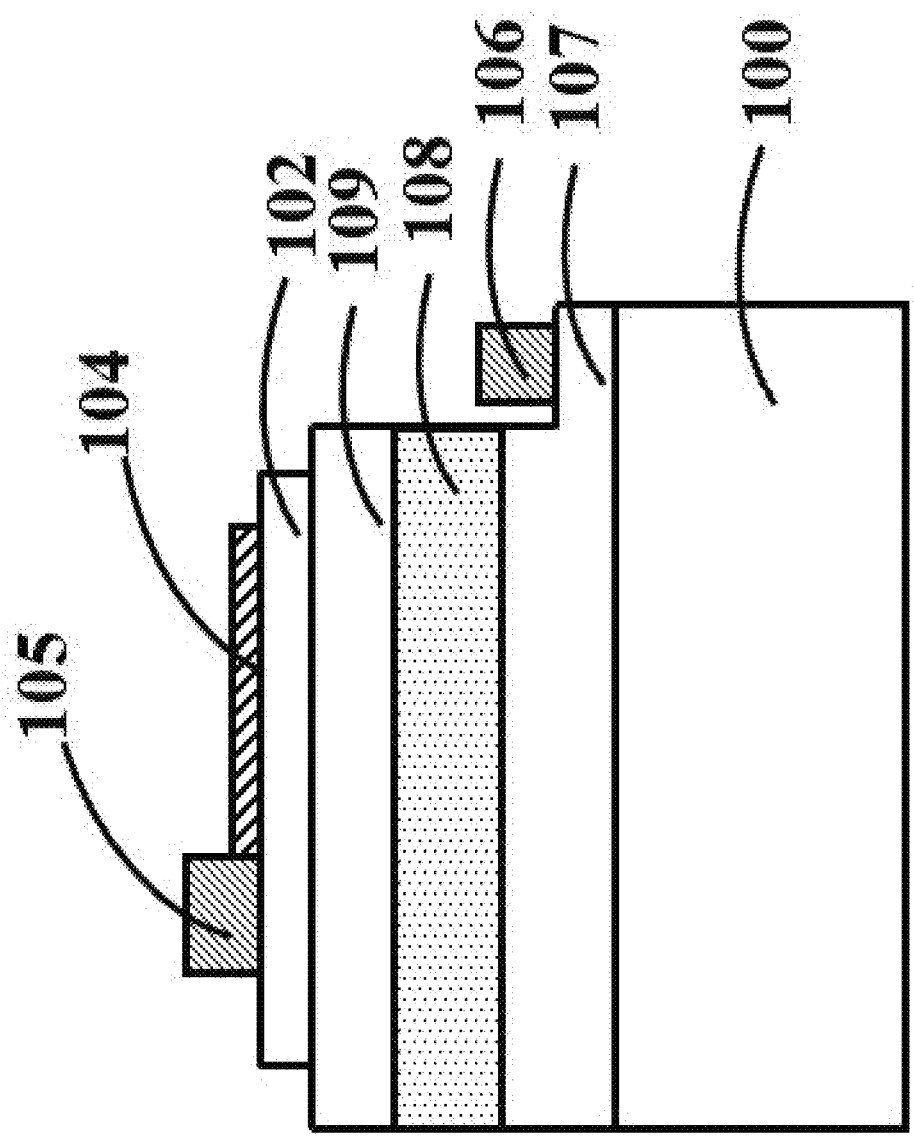
FIG. 2 is a cross-sectional view of the LED of FIG. 1.

As shown in FIGS. 1 and 2, a GaN-based LED with current spreading structure, comprising a sapphire substrate 100 at the bottom layer; a light-emitting epitaxial layer 101 over the substrate 100, which comprises, from bottom to up, an N—GaN layer 107, a light-emitting layer 108 and a P—GaN layer 109; an ITO transparent conducting layer 102 over the light-emitting epitaxial layer 101; a current spreading structure over the transparent conducting layer 102; the current spreading structure comprises an ITO transparent electrode spreading bar 103 and an Au metal electrode spreading bar 104 closely attached to the side wall of the transparent electrode spreading bar 103; a P electrode 105 over the ITO transparent conducting layer 102 and an N electrode 106 over the N—GaN layer 107.

The ITO transparent electrode spreading bar 103 can be fabricated by reactive magnetron sputtering and lifting-off, and have a thickness of about 1 µm; the Cr/Au metal electrode spreading bar 104 attached to the single-side wall of the ITO transparent electrode spreading bar 103 is about 0.3 µm wide and 1 µm thick.

As discussed above, according to some embodiments disclosed herein, a metal electrode spreading bar, which is extremely narrow and not vulnerable to tilting or wrapping, is formed at the side wall of the transparent electrode spreading bar for current spreading, thereby avoiding high chip voltage if only using the transparent electrode spreading bar; the luminous efficiency is greatly improved as the upper surface of the transparent electrode spreading bar has no metal electrode spreading bar which may cause shading; the structure is particularly suitable for high-power LED chips with several electrode spreading bars.

Although specific embodiments have been described above in detail, the description is merely for purposes of illustration. It should be appreciated, therefore, that many aspects described above are not intended as required or essential elements unless explicitly stated otherwise. Various modifications of, and equivalent acts corresponding to, the disclosed aspects of the exemplary embodiments, in addition to those described above, can be made by a person of ordinary skill in the art, having the benefit of the present disclosure, without departing from the spirit and scope of the disclosure defined in the following claims, the scope of which is to be accorded the broadest interpretation so as to encompass such modifications and equivalent structures.

The invention claimed is:

1. A GaN-based LED comprising:
    a substrate;
    a light-emitting epitaxial layer over the substrate; and
    a current spreading structure over the light-emitting epitaxial layer and including:
        a transparent electrode spreading bar; and
        a metal electrode spreading bar,
        wherein the metal electrode spreading bar is attached to a side wall of the transparent electrode spreading bar, and
        wherein the metal electrode spreading bar is narrower than the transparent electrode spreading bar to reduce tilting or wrapping and electrode shading while realizing current spreading.

2. The LED of claim 1, further comprising a transparent conducting layer over the light-emitting epitaxial layer, wherein the current spreading structure is disposed over the transparent conducting layer.

3. The LED of claim 2, wherein the substrate comprises at least one of sapphire (Al$_2$O$_3$), SiC, Si, or GaN.

4. The LED with of claim 2, wherein the transparent conducting layer comprises at least one of ITO, ZnO, CTO, InO, In-doped ZnO, Al-doped ZnO, or Ga-doped ZnO.

5. The LED of claim 2, wherein the transparent electrode spreading bar comprises at least one of ITO, ZnO, CTO, InO, In-doped ZnO, Al-doped ZnO, or Ga-doped ZnO.

6. The LED of claim 2, wherein the metal electrode spreading bar comprises at least one of Au, Ni/Au alloy, Cr/Au alloy, or Cr/Pt/Au alloy.

7. The LED of claim 2, wherein the transparent electrode spreading bar has a thickness of about 0.001-2 µm.

8. The LED of claim 2, wherein the metal electrode spreading bar has a thickness of about 0.001-2 µm.

9. The LED of claim 2, wherein the metal electrode spreading bar has a width of about 0.001-0.5 µm.

10. The LED of claim 1, wherein the metal electrode spreading bar is at a single-side wall or dual-side wall of the transparent electrode spreading bar, and has a thickness about the same as that of the transparent electrode spreading bar and a width of about 0.3 µm.

11. A lighting system comprising a plurality of GaN-based LEDs, each LED comprising:
    a substrate;
    a light-emitting epitaxial layer over the substrate; and
    a current spreading structure over the light-emitting epitaxial layer and including:
        a transparent electrode spreading bar; and
        a metal electrode spreading bar,
        wherein the metal electrode spreading bar is attached to a side wall of the transparent electrode spreading bar, and
        wherein the metal electrode spreading bar is narrower than the transparent electrode spreading bar to reduce tilting or wrapping and electrode shading while realizing current spreading.

12. The system of claim 10, wherein each LED further comprises a transparent conducting layer over the light-emitting epitaxial layer, and wherein the current spreading structure is disposed over the transparent conducting layer.

13. The system with of claim 12, wherein the transparent conducting layer comprises at least one of ITO, ZnO, CTO, InO, In-doped ZnO, Al-doped ZnO, or Ga-doped ZnO.

14. The system of claim 10, wherein the metal electrode spreading bar is at a single-side wall or dual-side wall of the transparent electrode spreading bar, and has a thickness about the same as that of the transparent electrode spreading bar.

15. The system of claim 10, wherein the substrate comprises at least one of sapphire (Al$_2$O$_3$), SiC, Si, or GaN.

16. The system of claim 10, wherein the transparent electrode spreading bar comprises at least one of ITO, ZnO, CTO, InO, In-doped ZnO, Al-doped ZnO, or Ga-doped ZnO.

17. The system of claim 10, wherein the metal spreading bar comprises at least one of Au, Ni/Au alloy, Cr/Au alloy, or Cr/Pt/Au alloy, and has a width of about 0.3 µm.

18. The system of claim 10, wherein the transparent electrode spreading bar has a thickness of about 0.001-2 µm.

19. The system of claim 10, wherein the metal electrode spreading bar has a thickness of about 0.001-2 μm, and a width of about 0.001-0.5 μm.

20. A method of fabricating a GaN-based LED, comprising:
growing a light-emitting epitaxial layer over a substrate;
forming a transparent conducting layer over a surface of the light-emitting epitaxial layer; and
growing a current spreading structure over the transparent conducting layer, the current spreading structure including:
a transparent electrode spreading bar; and
a metal electrode spreading bar,
wherein the metal electrode spreading bar is attached to a side wall of the transparent electrode spreading bar, and
wherein the metal electrode spreading bar is narrower than the transparent electrode spreading bar to reduce tilting or wrapping and electrode shading while realizing current spreading.

\* \* \* \* \*